United States Patent
Fujinami et al.

(10) Patent No.: US 8,999,062 B2
(45) Date of Patent: Apr. 7, 2015

(54) FILM DEPOSITING APPARATUS

(75) Inventors: Tatsuya Fujinami, Odawara (JP); Toshiya Takahashi, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 1440 days.

(21) Appl. No.: 12/404,022

(22) Filed: Mar. 13, 2009

(65) Prior Publication Data
US 2009/0229520 A1    Sep. 17, 2009

(30) Foreign Application Priority Data
Mar. 14, 2008 (JP) ................. 2008-065592

(51) Int. Cl.
| | |
|---|---|
| C23C 16/503 | (2006.01) |
| C23C 16/54 | (2006.01) |
| C23C 16/509 | (2006.01) |
| C23C 16/44 | (2006.01) |
| C23C 16/455 | (2006.01) |

(52) U.S. Cl.
CPC ........... *C23C 16/509* (2013.01); *C23C 16/4412* (2013.01); *C23C 16/45502* (2013.01); *C23C 16/545* (2013.01)

(58) Field of Classification Search
USPC ........................................................ 118/718
See application file for complete search history.

(56) References Cited

U.S. PATENT DOCUMENTS

| | | | | |
|---|---|---|---|---|
| 5,224,441 A | * | 7/1993 | Felts et al. | 118/718 |
| 5,300,189 A | * | 4/1994 | Kokaku et al. | 216/67 |
| 5,399,254 A | * | 3/1995 | Geisler et al. | 204/298.31 |
| 6,082,292 A | * | 7/2000 | Denes et al. | 118/718 |
| 2001/0039924 A1 | * | 11/2001 | Ozaki et al. | 118/723 E |
| 2009/0011146 A1 | * | 1/2009 | Yamada et al. | 427/575 |

FOREIGN PATENT DOCUMENTS

| | | | |
|---|---|---|---|
| JP | 2001-181850 A | | 7/2001 |
| JP | 2001185398 A | * | 7/2001 |
| JP | 2002-339075 A | | 11/2002 |
| JP | 2004095677 A | * | 3/2004 |
| JP | 2006-152416 A | | 6/2006 |
| JP | 2006-257503 A | | 9/2006 |
| WO | WO 2006109754 A1 | * | 10/2006 |

OTHER PUBLICATIONS

Office Action issued in corresponding Japanese Patent Application No. 2008-065592 dated Dec. 6, 2011.

* cited by examiner

*Primary Examiner* — Karla Moore
(74) *Attorney, Agent, or Firm* — Sughrue Mion, PLLC

(57) ABSTRACT

A film depositing apparatus comprises: a rotatable drum within a chamber around which a substrate is wrapped in a specified surface region; a film depositing unit comprising a film depositing electrode spaced facing to a surface of the drum, and a feed gas supply section supplying a feed gas for forming a film into a gap between the drum and the film depositing electrode; and an exhaust unit that exhausts the gap between the drum and the film depositing electrode during film formation by the film depositing unit so as to forcibly discharge the feed gas, supplied into the gap by the feed gas supply section, through at least one of end portions of the gap upstream side and downstream side in a rotating direction of the drum uniformly over an entire region of the gap in a direction parallel to the axis of rotation of the drum.

13 Claims, 2 Drawing Sheets

FILM DEPOSITING APPARATUS

The entire contents of a document cited in this specification are incorporated herein by reference.

BACKGROUND OF THE INVENTION

The present invention relates to a film depositing apparatus for forming a film on a surface of an elongated substrate in vacuum by CVD and, more particularly, to a film depositing apparatus which, when forming a film continuously on the elongated substrate as it is transported, is capable of forming a film having high uniformity in thickness in the direction of width of the substrate that is perpendicular to its longitudinal direction.

While various types of apparatus are known to be capable of continuous film deposition on an elongated substrate (a web of substrate) in a vacuum-filled chamber by plasma-enhanced CVD, an exemplary system uses a drum electrically connected to the ground and an electrode positioned in a face-to-face relationship with the drum and connected to a radio-frequency power source.

In this type of film depositing apparatus, the substrate is wrapped around a specified area of the drum, which is then rotated to thereby transport the substrate in a longitudinal direction as it is in registry with a specified film depositing position, with a radio-frequency voltage being applied between the drum and the electrode to form an electric field while, at the same time, a feed gas for film deposition as well as argon gas and the like are introduced between the drum and the electrode, whereby a film is deposited on the surface of the substrate by plasma-enhanced CVD. This type of film depositing apparatus has already been proposed (see JP 2006-152416 A).

JP 2006-152416 A discloses an apparatus for plasma-enhanced CVD that comprises a reaction compartment, gas inlets through which reactive gases are introduced into the reaction compartment, an anode and a cathode electrode that are provided within the reaction compartment to generate plasma discharge between themselves, and a transport mechanism that transports a flexible substrate between the anode and the cathode electrode; the apparatus treats the flexible substrate by plasma-enhanced CVD.

The reaction compartment has four gas discharging units for discharging the gas from the inside (see FIG. 1 in JP 2006-152416 A) and each gas discharging unit is equipped with a vacuum pump such as a mechanical booster pump or a rotary pump.

The anode electrode has a curved, first discharge surface whereas the cathode electrode has a second discharge surface that is curved along the first discharge surface. The cathode electrode is provided with an electrode-to-electrode distance adjusting mechanism for moving it in a direction parallel to the diameter of the anode electrode, as well as a curvature adjusting mechanism for performing fine adjustment on the curvature of the second discharge surface in accordance with the distance between the anode and cathode electrodes.

SUMMARY OF THE INVENTION

In the plasma-enhanced CVD apparatus disclosed in JP 2006-152416 A, the reaction compartment is equipped with four gas discharging units for discharging the gas from the inside; however, these units are not provided in symmetrical positions but are located eccentrically with respect to the space between the first discharge surface of the anode electrode and the second discharge surface of the cathode electrode. Thus, in JP 2006-152416 A, when reactive gases are supplied for film deposition, with the flexible substrate being provided between the first discharge surface of the anode electrode and the second discharge surface of the cathode electrode, these reactive gases are discharged in various directions including, for example, the direction of width of the flexible substrate. In this case, the reactive gases flow from the center of the flexible substrate toward either end, where they accumulate to form a film that is thicker at both ends of the flexible substrate to thereby yield an uneven thickness distribution in the direction of its width. Hence, the plasma-enhanced CVD apparatus disclosed in JP 2006-152416 A, which does not take into account the direction in which the reactive gases are to be discharged, has the problem that it is unable to produce films having a uniform thickness distribution.

An object, therefore, of the present invention is to solve the aforementioned problem of the prior art by providing a film depositing apparatus which, when forming a film continuously on an elongated substrate as it is transported, is capable of forming a film having high uniformity in thickness in the direction of width of the substrate that is perpendicular to its longitudinal direction.

A film depositing apparatus according to the present invention comprises: a transport means that transports an elongated substrate in a specified transport path; a chamber; an evacuating unit that creates a specified degree of vacuum within the chamber; a rotatable drum that is provided within the chamber, that has an axis of rotation in a direction perpendicular to a transport direction of the substrate by the transport means, and around which the substrate transported by the transport means is wrapped in a specified surface region; a film depositing unit comprising a film depositing electrode spaced apart from and in a face-to-face relationship with a surface of the drum, a radio-frequency power source section for applying a radio-frequency voltage to the film depositing electrode, and a feed gas supply section from which a feed gas for forming a film is supplied into a gap between the drum and the film depositing electrode; and an exhaust means that exhausts the gap between the drum and the film depositing electrode during film formation by the film depositing unit so as to forcibly discharge the feed gas, supplied into the gap by the feed gas supply section, through at least one of end portions of the gap upstream side and downstream side in a rotating direction of the drum uniformly over an entire region of the gap in a direction parallel to the axis of rotation of the drum.

DETAILED DESCRIPTION OF THE INVENTION

On the following pages, the film depositing apparatus of the present invention is described in detail with reference to the preferred embodiment shown in the accompanying drawings.

Figure 1:
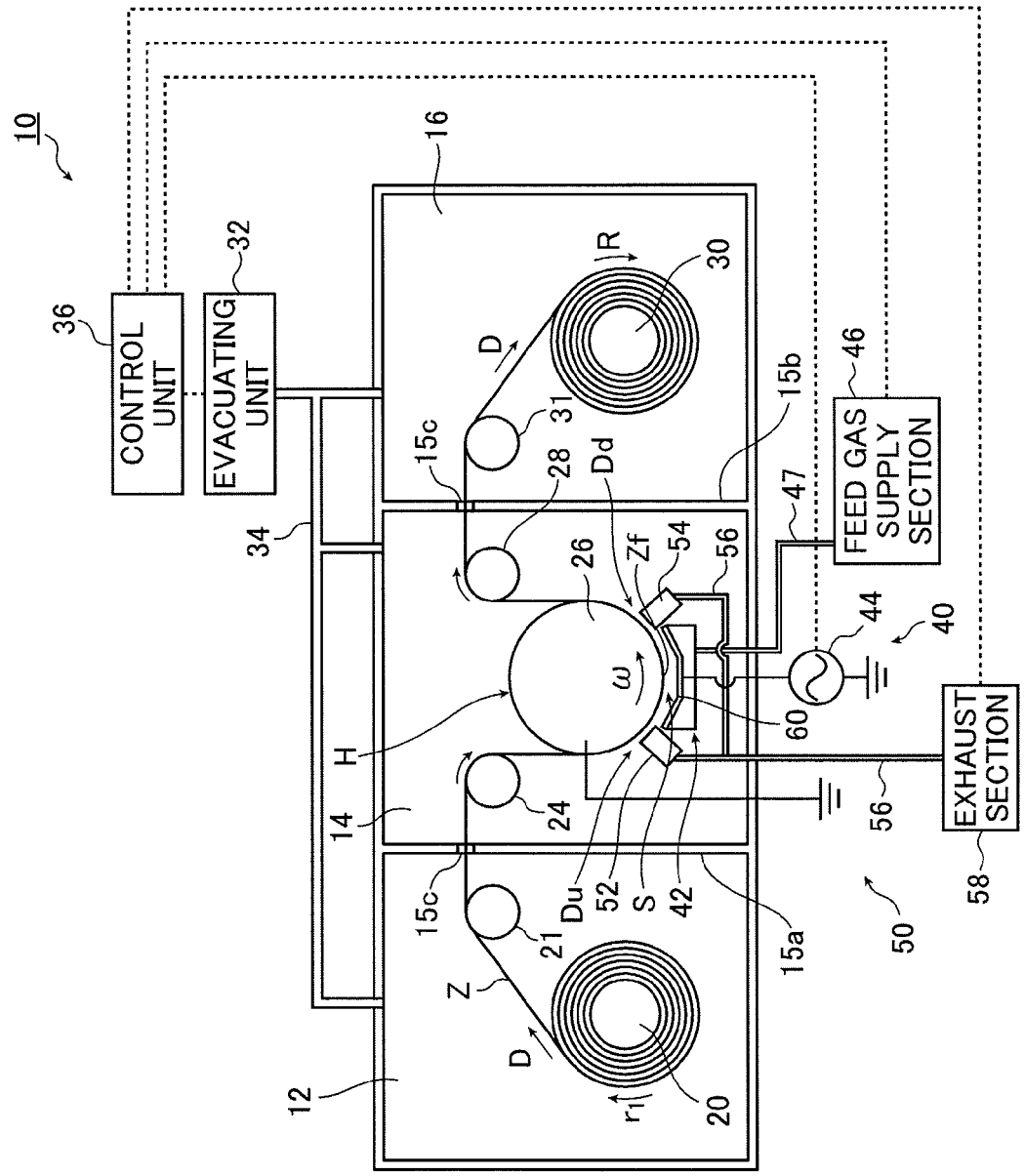
FIG. 1 is a schematic diagram showing a film depositing apparatus according to an embodiment of the present invention.
Figure 2A:
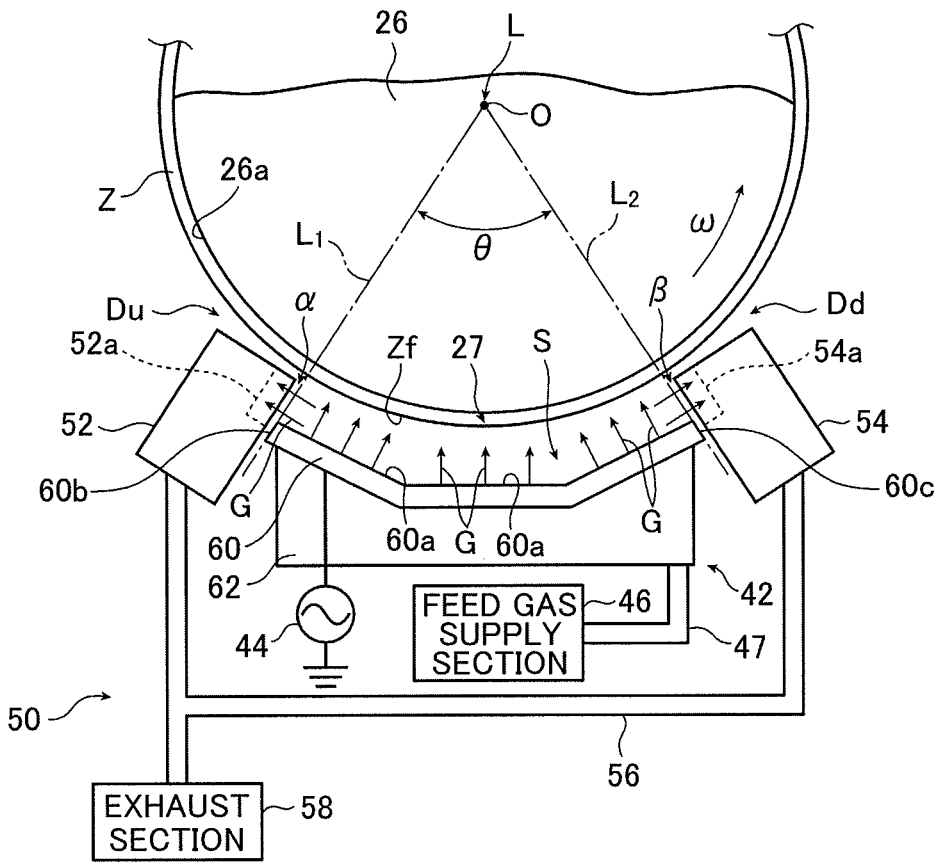
FIGS. 2A and 2B are a schematic side view and a schematic plan view showing the relative positions of a drum, a film depositing electrode and exhaust boxes in the film depositing compartment of the film depositing apparatus shown in FIG. 1.
Figure 2B:
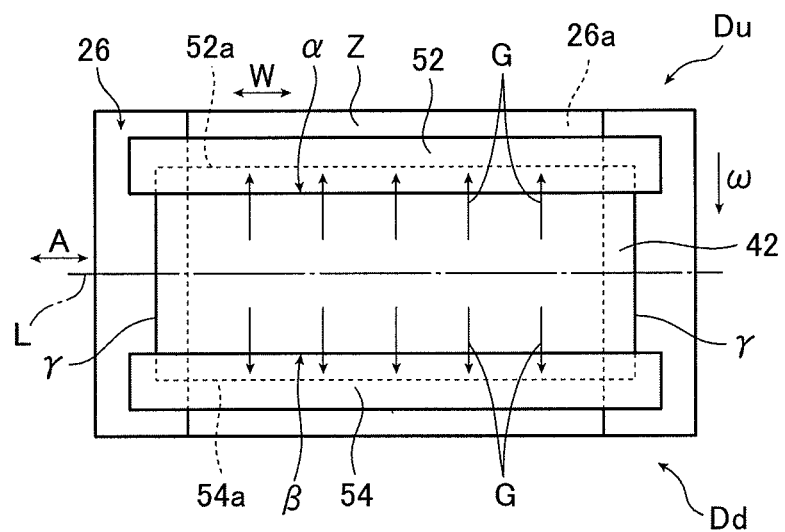

FIG. 1 is a schematic diagram showing a film depositing apparatus according to an embodiment of the present invention. FIG. 2A is a schematic side view showing the relative positions of a drum, a film depositing electrode and an exhaust means in a film depositing compartment of the film depositing apparatus shown in FIG. 1. FIG. 2B is a schematic plan view showing the relative positions of the drum, the film depositing electrode and exhaust boxes in the film depositing compartment of the film depositing apparatus shown in FIG. 1.

The film depositing apparatus generally indicated by 10 in FIG. 1 according to the embodiment under consideration is a roll-to-roll type machine that forms a film with a specified function on the surface Zf of a substrate Z or on the surface of an organic layer if one is formed on the surface Zf of the substrate Z; the film depositing apparatus 10 is typically employed to produce functional films such as an optical film or a gas barrier film.

The film depositing apparatus 10 is an apparatus for continuously depositing a film on an elongated substrate Z (a web of substrate Z); it comprises basically a feed compartment 12 for feeding the elongated substrate Z, a film depositing compartment (chamber) 14 for forming a film on the elongated substrate Z, a take-up compartment 16 for winding up the elongated substrate Z after the film has been formed on it, an evacuating unit 32, and a control unit 36. The control unit 36 controls the actions of the individual elements of the film depositing apparatus 10.

In the film depositing apparatus 10, the feed compartment 12 and the film depositing compartment 14 are partitioned by a wall 15a whereas the film depositing compartment 14 and the take-up compartment 16 are partitioned by a wall 15b; a slit of opening 15c through which the substrate Z can pass is formed in each of the walls 15a and 15b.

In the film depositing apparatus 10, each of the feed compartment 12, the film depositing compartment 14 and the take-up compartment 16 is connected to the evacuating unit 32 via a piping system 34. The evacuating unit 32 creates a specified degree of vacuum in the interiors of the feed compartment 12, the film depositing compartment 14, and the take-up compartment 16.

To evacuate the feed compartment 12, the film depositing compartment 14 and the take-up compartment 16 to maintain a specified degree of vacuum, the evacuating unit 32 has vacuum pumps such as a dry pump and a turbo-molecular pump. Each of the feed compartment 12, the film depositing compartment 14 and the take-up compartment 16 is equipped with a pressure sensor (not shown) for measuring the internal pressure.

Note that the ultimate degree of vacuum that should be created in the feed compartment 12, the film depositing compartment 14 and the take-up compartment 16 by the evacuating unit 32 is not particularly limited and an adequate degree of vacuum suffices to be maintained in accordance with such factors as the method of film deposition to be implemented. The evacuating unit 32 is controlled by the control unit 36.

The feed compartment 12 is a site for feeding the elongated substrate Z, where a substrate roll 20 and a guide roller 21 are provided.

The substrate roll 20 is for delivering the elongated substrate Z continuously and it typically has the substrate Z wound around it.

The substrate roll 20 is typically connected to a motor (not shown) as a drive source. By means of this motor, the substrate roll 20 is rotated in a direction r in which the substrate Z is rewound; in the embodiment under consideration, the substrate roll 20 is rotated clockwise to deliver the substrate Z continuously in FIG. 1.

The guide roller 21 is for guiding the substrate Z into the film depositing compartment 14 in a specified transport path. The guide roller 21 is composed of a known guide roller.

In the film depositing apparatus 10 of the embodiment under consideration, the guide roller 21 may be a drive roller or a follower roller. Alternatively, the guide roller 21 may be a roller that works as a tension roller that adjusts the tension that develops during the transport of the substrate Z.

In the film depositing apparatus of the present invention, the substrate Z is not particularly limited and all kinds of substrates can be employed as long as films can be formed by vapor-phase film deposition techniques. Usable as the substrate Z are various resin films such as a PET film, or various metals sheets such as an aluminum sheet.

The take-up compartment 16 is a site where the substrate Z with a film having been formed on the surface Zf in the film depositing compartment 14 is wound up; in this take-up compartment 16, there are provided a take-up roll 30 and a guide roller 31.

The take-up roll 30 is a device by which the substrate Z on which a film has been deposited is wound up in a roll.

The take-up roll 30 is typically connected to a motor (not shown) as a drive source. By means of this motor, the take-up roll 30 is rotated to wind up the substrate Z after the film deposition step.

By means of the motor, the take-up roll 30 is rotated in a direction R in which the substrate Z is wound up; in the embodiment under consideration, the take-up roll 30 is rotated clockwise in FIG. 1, whereupon the substrate Z after the film deposition step is wound up continuously.

The guide roller 31 is similar to the aforementioned guide roller 21 in that the substrate Z being delivered from the film depositing compartment 14 is guided by this roller to the take-up roll 30 in a specified transport path. The guide roller 31 is composed of a known guide roller. Note that like the guide roller 21 in the feed compartment 12, the guide roller 31 may be a drive roller or a follower roller. Alternatively, the guide roller 31 may be a roller that works as a tension roller.

The film depositing compartment 14 functions as a vacuum chamber and it is a site where a film is continuously formed on the surface Zf of the substrate Z by a vapor-phase film deposition technique, typically by plasma-enhanced CVD, as the substrate Z is being transported.

The film depositing compartment 14 is typically constructed by using materials such as stainless steel that are commonly employed in a variety of vacuum chambers.

In the film depositing compartment 14, there are provided two guide rollers 24 and 28, as well as a drum 26, a film depositing unit 40, and an exhaust means.

The guide rollers 24 and 28 are spaced apart parallel to each other in a face-to-face relationship; they are also provided in such a way that their longitudinal axes cross at right angles to a direction D in which the substrate Z is transported.

The guide roller 24 is a device by which the substrate Z delivered from the guide roller 21 provided in the feed compartment 12 is transported to the drum 26. The guide roller 24 is rotatable, typically having an axis of rotation in a direction perpendicular to the transport direction D of the substrate Z (this direction is hereinafter referred to as the axial direction), and its length in the axial direction is greater than the length in a width direction W that is perpendicular to the longitudinal direction of the substrate Z (the latter length is hereinafter referred to as the width of the substrate Z).

Note that the substrate roll 20 and the guide rollers 21 and 24 combine to constitute a first transport means in the present invention.

The guide roller 28 is a device by which the substrate Z wrapped around the drum 26 is transported to the guide roller 31 provided in the take-up compartment 16. The guide roller 28 is rotatable, typically having an axis of rotation in the axial direction, and its length in the axial direction is greater than the width of the substrate Z.

Note that the guide rollers 28 and 31 as well as the take-up roll 30 combine to constitute a second transport means in the present invention.

Except for the features just described above, the guide rollers 24 and 28 have the same structure as the guide roller 21 provided in the feed compartment 12, so they will not be described in detail.

The drum 26 is provided below the space H between the guide rollers 24 and 28. The drum 26 is so positioned that its longitudinal axis is parallel to those of the guide rollers 24 and 28. Also note that the drum 26 is electrically connected to the ground.

The drum 26 typically assumes a cylindrical shape, has a rotational axis L (see FIG. 2), and is capable of rotating about the rotational axis L in the direction of rotation ω. Also note that the length of the drum 26 in the axial direction A (longitudinal direction) is greater than the width of the substrate Z. The drum 26, as it rotates with the substrate Z wrapped around its surface 26a (peripheral surface), transports the substrate Z in the transport direction D while it is kept in registry with a specified film depositing position.

It is assumed that the side to the direction of travel parallel to the direction of rotation ω of the drum 26, namely, the side to which the substrate Z is transported is the downstream side Dd, and the side opposite to this downstream side Dd is the upstream side Du.

For temperature adjustment, the drum 26 may be provided in its center with a heater (not shown) for heating the drum 26 and a temperature sensor (also not shown) for measuring the temperature of the drum 26. In this case, the heater and the temperature sensor are connected to the control unit 36 which adjusts the temperature of the drum 26 such that it is held at a specified temperature.

As shown in FIG. 1, the film depositing unit 40 is provided below the drum 26 which, with the substrate Z being wrapped around it, rotates so that a film is formed on the surface Zf of the substrate Z as it is transported in the transport direction D.

The film depositing unit 40 is a device to form a film, typically by capacitively coupled plasma enhanced CVD (CCP-CVD). The film depositing unit 40 has a film depositing electrode 42, a radio-frequency power source 44, and a feed gas supply section 46. The control unit 36 controls the radio-frequency power source 44 and the feed gas supply section 46 in the film depositing unit 40.

In the film depositing unit 40, the film depositing electrode 42 is provided in the lower part of the film depositing compartment 14 such that it is spaced by a specified gap S from the surface 26a of the drum 26.

As shown in FIG. 2A, the film depositing electrode 42 has a film depositing electrode plate 60 and a holder 62 that holds the film depositing electrode plate 60.

The film depositing electrode plate 60 may be formed by bending a rectangular member in two places.

The film depositing electrode plate 60 is disposed along the direction of rotation ω as if to follow the surface 26a of the drum 26, with its length being parallel to the rotational axis L of the drum 26 (see FIG. 2A) and with its surface 60a being oriented to the surface 26a of the drum 26.

In the embodiment under consideration, the film depositing electrode plate 60 is typically disposed in such a way that it aligns with lines tangent to a circle concentric with the surface 26a of the drum 26. The film depositing electrode plate 60 is bent but in any of its planar regions, it is set at a specified distance as measured between its surface 60a and the surface 26a of the drum 26 on a line that is perpendicular to the surface 60a and which passes through the center of rotation ○ of the drum 26.

In the embodiment under consideration, the film depositing electrode plate 60 is bent to follow the surface 26a of the drum 26 but this is not the sole case of the present invention and a number of flat rectangular electrode platelets may be arranged along the direction of rotation ω so as to follow the surface 26a of the drum 26. In this alternative case, electrical conduction is established between the individual electrode platelets, which are arranged in such a way that each electrode platelet is set at a specified distance as measured between the surface of each electrode platelet and the surface of the drum on a line that is perpendicular to the surface of each electrode platelet and which passes through the center of rotation ○ of the drum 26.

As shown in FIG. 1, The film depositing electrode 42 (film depositing electrode plate 60) is connected to the radio-frequency power source 44, which applies a radio-frequency voltage to the film depositing electrode plate 60 in the film depositing electrode 42. The radio-frequency power source 44 is capable of varying the radio-frequency power (RF power) to be applied.

Note that the film depositing electrode 42 and the radio-frequency power source 44 may optionally be connected to each other via a matching box in order to attain impedance matching.

The film depositing electrode 42 is of a type that is generally called "a shower head electrode" and the film depositing electrode plate 60 has a plurality of through-holes (not shown) formed at equal spacings in its surface 60a. By means of this film depositing electrode 42, the feed gas G is supplied uniformly into the gap S.

The holder 62 is for holding the film depositing electrode plate 60 and, with its interior being hollow (not shown), is connected to the feed gas supply section 46 via a pipe 47. The hollow portion of the holder 62 communicates with the plurality of through-holes formed in the surface 60a of the film depositing electrode plate 60.

As will be described later, the feed gas G supplied from the feed gas supply section 46 flows through the pipe 47, the hollow portion of the holder 62 and the plurality of through-holes in the film depositing electrode plate 60 to be released from the surface 60a of the film depositing electrode plate 60 so that it is supplied uniformly into the gap S.

To adjust the temperature of the film depositing electrode plate 60, the holder 62 may be equipped with a heater (not shown) for heating the film depositing electrode plate 60 and a temperature sensor (also not shown) for measuring the film depositing electrode plate 60. In this case, the heater and the temperature sensor are connected to the control unit 36 which adjusts the temperature of the film depositing electrode plate 60 such that it is held at a specified temperature.

As just described above, the drum 26 and the film depositing electrode plate 60 are each equipped with the heater (not shown) and the temperature sensor (also not shown); this design ensures that the drum 26 has the same temperature as the film depositing electrode plate 60.

The feed gas supply section 46 uniformly supplies the film-forming feed gas G into the gap S through the plurality of through-holes formed in the surface 60a of the film depositing electrode plate 60 in the film depositing electrode 42. The gap S between the surface 26a of the drum 26 and the film depositing electrode 42 serves as a space where plasma is to be generated, hence, as a film deposition space.

In the embodiment under consideration, if a SiO$_2$ film is to be formed, the feed gas G is a TEOS gas, with oxygen gas being used as an active species gas. If a silicon nitride film is to be formed, SiH$_4$ gas, NH$_3$ gas and N$_2$ gas (dilution gas) are used. In the embodiment under consideration, even a feed gas containing an active species gas and a dilution gas is simply referred to as a feed gas.

The feed gas supply section 46 may be chosen from a variety of gas introducing means that are employed in the CVD apparatus.

Also note that the feed gas supply section 46 may supply into the gap S not only the feed gas G but also an inert gas such as argon or nitrogen gas, an active species gas such as oxygen gas, and various other gases that are used in CVD. In this case of introducing more than one species of gas, the respective gases may be mixed together in the same pipe and the mixture be passed through the plurality of holes in the film depositing electrode 42 to be supplied into the gap S; alternatively, the respective gases may be supplied through different pipes and hence passed through the plurality of holes in the film depositing electrode 42 to be supplied into the gap S.

The kinds of the feed gas, the inert gas and the active species gas, as well as the amounts in which they are introduced may be chosen and set as appropriate for various considerations including the kind of the film to be formed and the desired film deposition rate.

Note that the radio-frequency power source 44 may be of any known type that is employed in film deposition by plasma-enhanced CVD. The maximum power output and other characteristics of the radio-frequency power source 44 are not particularly limited and may be chosen and set as appropriate for various considerations including the kind of the film to be formed and the desired film deposition rate.

The film depositing electrode 42 is in no way limited to a rectangular plate form and various other electrode configurations may be adopted as long as they are capable of film deposition by CVD; to give one example, it may consist of electrode segments that are arranged in the axial direction of the drum 26.

In the embodiment under consideration, the film depositing electrode 42 is of such a configuration that through-holes are formed in the surface 60*a* of the film depositing electrode plate 60. However, this is not the sole embodiment of the present invention and other configurations are possible as long as they are capable of uniformly supplying the feed gas G into the gap S which serves as the film deposition space; for example, slits of opening may be formed in the bent portions of the film depositing electrode plate 60 such that the feed gas G is released through the slits.

Also suppose the following on the assumption that the film depositing electrode plate 60 has two end portions 60*b* and 60*c* as shown in FIG. 2A: the line by which the end portion 60*b* on the upstream side Du in the direction of rotation ω of the drum 26 is connected to the center of rotation O of the drum 26 is written as the first line L$_1$; the line by which the end portion 60*c* on the downstream side Dd in the direction of rotation O of the drum 26 is connected to the center of rotation O of the drum 26 is written as the second line L$_2$; the angle formed between the first line L$_1$ and the second line L$_2$ is written as θ. Since a film is deposited on the surface Zf of the substrate Z over the range of angle θ, the range of angle θ is the film deposition zone 27.

The exhaust means 50 is such that the gap S can be uniformly exhausted over the entire region in a direction parallel to the rotating axis of the drum 26 for both of its end portions α and β in the rotating direction ω; the exhaust means 50 has a first exhaust box 52, a second exhaust box 54, and an exhaust section 58. The first exhaust box 52 and the second exhaust box 54 are connected to the exhaust section 58 through a pipe 56.

As shown in FIG. 2A, the first exhaust box 52 is provided so as to cover an end portion α of the gap S between the drum 26 and the film depositing electrode 42 which is upstream Du in the direction ω in which the drum 26 rotates. As shown in FIG. 2B, the first exhaust box 52 provided at the end portion α of the gap S is larger than the entire region of the end portion α and longer than that end portion α in a direction parallel to the rotating axis L of the drum 26. The first exhaust box 52 has an opening 52*a* formed therein in a face-to-face relationship with the end portion α of the gap S such that it is larger than the entire region of the end portion α of the gap S.

The second exhaust box 54 is provided in a different position than, but has the same structure as, the first exhaust box 52. The second exhaust box 54 is provided so as to cover an end portion β of the gap S between the drum 26 and the film depositing electrode 42 which is downstream Dd in the direction ω in which the drum 26 rotates. The second exhaust box 54 provided at the end portion β of the gap S is larger than the entire region of the end portion β and longer than that end portion β in a direction parallel to the rotating axis L of the drum 26. The second exhaust box 54 has an opening 54*a* formed therein in a face-to-face relationship with the end portion β of the gap S such that it is larger than the entire region of the end portion β of the gap S.

As long as they are utilized to effect uniform exhaust, the first exhaust box 52 and the second exhaust box 54 are not particularly limited in terms of their structure and they may be adapted to have a rectifying plate.

By means of the first exhaust box 52 and the second exhaust box 54, the exhaust section 58 ensures that the feed gas G as supplied into the gap S is uniformly discharged from its end portions α and β, typically in such a mode as a uniform volume or rate of exhaust, over the entire region of the gap S in the axial direction A of the drum 26 (in the direction of width W of the substrate Z); to this end, the exhaust section 58 typically has a vacuum pump. This exhaust section 58 is connected to the control unit 36, which controls the discharging of the feed gas G by means of the first exhaust box 52 and the second exhaust box 54.

After the feed gas G is supplied into the gap S during film deposition and plasma is then generated, the exhaust means 50 in the embodiment under consideration discharges the feed gas G in the gap S by the exhaust section 58 via the first exhaust box 52 and the second exhaust box 54. On this occasion, the feed gas G in the gap S is uniformly discharged from its end portions α and β along the peripheral surface 26*a* of the drum 26 by means of the first exhaust box 52 and the second exhaust box 54 over the entire region of the gap S in the axial direction A of the drum 26 (in the direction of width W of the substrate Z).

Thus, the exhaust means 50 allows the feed gas G to be discharged preferentially from the two end portions α and β of the gap S. As a result, even if the interior of the film depositing compartment 14 has a specified degree of vacuum, the feed gas G is inhibited from being discharged through the end portions γ of the gap S in the axial direction A of the drum 26 (in the direction of width W of the substrate Z). Hence, the feed gas G in the gap S is discharged uniformly in the direction of width W of the substrate Z while the feed gas G is supplied uniformly in the direction of width W.

In the embodiment under consideration, the first exhaust box 52 and the second exhaust box 54 are provided at the end portions α and β, respectively, of the gap S; it should, however, be noted that the present invention is by no means limited to this particular case and the first exhaust box 52 or the second exhaust box 54 may be provided in at least one of the two end portions α and β of the gap S. Alternatively, the pipe 56 may be fitted with a valve that enables the exhaust section 58 to discharge the feed gas G from either the first exhaust box 52 or the second exhaust box 54 or both.

We next describe how the film depositing apparatus 10 works in the embodiment under consideration.

In the specified path starting from the feed compartment 12 and passing through the film depositing compartment 14 to reach the take-up compartment 16, the elongated substrate Z is transported through the film depositing apparatus 10 from the feed compartment 12 down to the take-up compartment 16 while a film is formed on the substrate Z in the film depositing compartment 14.

In the film depositing apparatus 10, the elongated substrate Z that has been wound around the substrate roll 20 is unwound and transported into the film depositing compartment 14 via the guide roller 21. In the film depositing compartment 14, the substrate Z passes over the guide roller 24, the drum 26 and the guide roller 28 to be transported into the take-up compartment 16. In the take-up compartment 16, the elongated substrate Z passes over the guide roller 31 to be wound up by the take-up roll 30. After passing the elongated substrate Z through this transport path, a specified degree of vacuum is maintained in the interiors of the feed compartment 12, the film depositing compartment 14 and the take-up compartment 16 by means of the evacuating unit 32; then, in the film depositing unit 40, a radio-frequency voltage is applied from the radio-frequency power source 44 to the film depositing electrode 42 while, at the same time, the feed gas G to form a film is uniformly supplied from the feed gas supply section 46 through the pipe 47 and the holder 62 so that it is released into the gap S through the plurality of through-holes formed in the surface 60a of the film depositing electrode plate 60.

When electromagnetic waves are radiated around the film depositing electrode 42, a plasma localized in the neighborhood of the film depositing electrode 42 is generated in the gap S, whereupon the feed gas is excited and dissociated to yield a reaction product that serves to form a film. This reaction product accumulates to form a film of specified thickness on the surface Zf of the substrate Z within the range of the film depositing electrode 42, namely, in the film deposition zone 27 defined by the range of angle θ about the center of rotation O of the drum 26.

On this occasion, the control unit 36 drives the exhaust section 58 in the exhaust means 50 such that the first exhaust box 52 and the second exhaust box 54 cause the feed gas G in the gap S to be preferentially discharged from its end portions α and β. Thus, the feed gas G in the gap S is uniformly discharged from its end portions α and β along the surface 26a of the drum 26 over the entire region of the gap S in the axial direction A of the drum 26 (in the direction of width W of the substrate Z). As a result, even if the interior of the film depositing compartment 14 has a specified degree of vacuum, the feed gas G is inhibited from being discharged through the end portions γ of the gap S in the axial direction A of the drum 26 (in the direction of width W of the substrate Z). Consequently, the reaction product formed by the feed gas G is supplied uniformly in the direction of width W of the substrate Z so that it accumulates on the surface Zf of the substrate Z uniformly in the direction of width W of the substrate Z. As a result, a uniform film having a small thickness distribution in the direction of width W is formed in a specified thickness.

Then, the substrate roll 20 around which the elongated substrate Z has been wound is rotated clockwise incrementally by means of the motor, whereupon the elongated substrate Z is delivered continuously and with the substrate Z being held on the drum 26 in the position where the plasma is being generated, the drum 26 is rotated at a specified speed to ensure that the film depositing unit 40 allows a layer to be formed continuously in a specified thickness on the surface Zf of the elongated substrate Z, particularly in such a way that it is uniform with a small thickness distribution in the direction of width W of the substrate Z. The substrate Z having the specified layer formed on its surface Zf passes over the guide rollers 28 and 31 so that the functional film, or the elongated substrate Z with the deposited layer, is wound up by the take-up roll 30.

Described above is the way in which the elongated substrate Z having the layer formed continuously in a specified thickness on the surface Zf, particularly in such a way that it is uniform with a small thickness distribution in the direction of width W of the substrate Z, namely, the functional film, can be produced by the film depositing apparatus 10 according to the embodiment under consideration. The function of the functional film produced depends on the properties or the type of the layer formed on the substrate Z.

In the foregoing embodiment of the present invention, the layer to be deposited is not particularly limited and as long as the CVD process is applicable, layers having the required functions that depend on the functional films to be produced can appropriately be formed. The thickness of the layer to be deposited is not particularly limited, either, and the required thickness may be determined as appropriate for the performance required by the functional film to be produced.

It should also be noted that the number of layers to be deposited is not limited to one but may be two or more. If a multi-layer film is to be formed, the individual layers may be the same or different from each other.

In the foregoing embodiment of the present invention, if a gas barrier film (water vapor barrier film) is to be produced as the functional film, the layer to be deposited on the substrate is an inorganic film such as a silicon nitride film, an aluminum oxide film, or a silicon oxide film.

If protective films for a variety of devices or apparatuses including display devices such as organic EL displays and liquid-crystal displays are to be produced as the functional film, the layer to be deposited on the substrate is an inorganic film such as a silicon oxide film.

Further in addition, if the functional film produced is any of an anti-light reflective film, a light reflective film, and various other optical films for use in filters, the layer to be deposited on the substrate is a film having the desired optical characteristics or a film comprising materials that exhibit the desired optical characteristics.

The functional film thus produced by the film depositing apparatus 10 according to the foregoing embodiment of the present invention is characterized in that the layer formed on the substrate has superior uniformity in thickness and, hence, uniform thickness, particularly in the direction of width of the substrate, so the functional film, if it is a gas barrier film, features good enough gas barrier property.

The film depositing apparatus of the present invention is provided with the exhaust means by which the gap between the drum and the film depositing electrode into which a feed gas is supplied to generate a plasma during film deposition can be uniformly exhausted over the entire region in a direction parallel to the axis of rotation of the drum for an end portion either upstream or downstream in the rotating direction of the drum or for both end portions, whereby during film deposition, the feed gas can be uniformly discharged from at least one of the two end portions of the gap by this exhaust means in the direction in which the axis of rotation of the drum extends, namely, in the direction of width of the substrate. Thus, during film deposition, the feed gas is uniformly discharged in the direction of width of the substrate and the reaction deposit that is generated from the feed gas by means of plasma accumulates uniformly in the direction of width of the substrate. This enables the formation of a film which, in particular, has a small thickness distribution and superior uniformity in thickness in the direction of width of the substrate.

While the film depositing apparatus of the present invention has been described above in detail, the present invention is by no means limited to the foregoing embodiment and it should be understood that various improvements and modifications are possible without departing from the scope and spirit of the present invention.

What is claimed is:

1. A film depositing apparatus comprising:
    a transport means that transports an elongated substrate in a specified transport path;
    a chamber;
    an evacuating unit that creates a specified degree of vacuum within the chamber;
    a rotatable drum that is provided within the chamber, that has an axis of rotation in a direction perpendicular to a transport direction of the substrate by the transport means, and around which the substrate transported by the transport means is wrapped in a specified surface region;
    a film depositing unit comprising a film depositing electrode spaced apart by a distance D from a surface of the drum and in a face-to-face relationship with the surface of the drum, said film depositing electrode having a first end at a most upstream direction of rotation of the drum and a second end at a most downstream direction of rotation of the drum a radio-frequency power source section for applying a radio-frequency voltage to the film depositing electrode, and a feed gas supply section from which a feed gas for forming a film is supplied into a gap between the drum and the film depositing electrode; and
    an exhaust box, said exhaust box separately formed from the film depositing unit and disposed in a first direction parallel to the axis of the rotation of the drum and being longer than the electrode in the first direction and said exhaust box having a longitudinal opening oriented in the first direction and said longitudinal opening also being longer than the electrode in the first direction, said longitudinal opening also having a width dimension larger than the distance D, said exhaust box disposed such that the longitudinal opening faces at least one of the first end and the second end of the film depositing electrode,
    wherein the longitudinal opening is oriented away from the surface of the drum, and
    wherein the electrode has a first segment adjacent to the first end, and said electrode is disposed so that the first segment is parallel to a tangent line to the surface of the drum, and wherein the exhaust box is disposed so that the width dimension of the longitudinal opening extends in a direction that is oriented to be parallel to a line running from the center of the drum to the first end of the electrode.

2. The film depositing apparatus according to claim 1, further comprising an exhaust section that exhausts the exhaust box via the longitudinal opening.

3. The film depositing apparatus according to claim 2 wherein the exhaust section is adapted to discharge the feed gas in a uniform volume.

4. The film depositing apparatus according to claim 2 wherein the exhaust section is adapted to discharge the feed gas in a uniform rate of exhaust.

5. The film depositing apparatus according to claim 1, wherein the film depositing electrode is a shower head electrode.

6. The film depositing apparatus according to claim 1, wherein the film depositing electrode has a film depositing electrode plate which is disposed along the direction of rotation of the drum so as to follow the surface of the drum, with its length being parallel to the rotational axis of the drum and with its surface being oriented to the surface of the drum.

7. The film depositing apparatus according to claim 6, wherein the film depositing electrode plate is a flat rectangular electrode platelet which is bent to follow the surface of the drum.

8. The film depositing apparatus according to claim 7, wherein slits of opening, from which the feed gas is supplied into the gap between the drum and the film depositing electrode, are formed in bent portions of the film depositing electrode plate.

9. The film depositing apparatus according to claim 6, wherein the film depositing electrode plate is a plurality of flat rectangular electrode platelets which are arranged along the direction of rotation of the drum so as to follow the surface of the drum.

10. The film depositing apparatus according to claim 9, wherein slits of opening, from which the feed gas is supplied into the gap between the drum and the film depositing electrode, are formed in joint portions of the electrode platelets.

11. The apparatus of claim 1, wherein the longitudinal opening faces the gap between the drum and the electrode.

12. A film depositing apparatus comprising:
    a transport means that transports an elongated substrate in a specified transport path;
    a chamber;
    an evacuating unit that creates a specified degree of vacuum within the chamber;
    a rotatable drum that is provided within the chamber, that has an axis of rotation in a direction perpendicular to a transport direction of the substrate by the transport means, and around which the substrate transported by the transport means is wrapped in a specified surface region;
    a film depositing unit comprising a film depositing electrode spaced apart by a distance D from a surface of the drum and in a face-to-face relationship with the surface of the drum, said film depositing electrode having a first end at a most upstream direction of rotation of the drum and a second end at a most downstream direction of rotation of the drum a radio-frequency power source section for applying a radio-frequency voltage to the film depositing electrode, and a feed gas supply section from which a feed gas for forming a film is supplied into a gap between the drum and the film depositing electrode;
    an exhaust box, said exhaust box separately formed from the film depositing unit and disposed in a first direction parallel to the axis of the rotation of the drum and being longer than the electrode in the first direction and said exhaust box having a longitudinal opening oriented in the first direction and said longitudinal opening also being longer than the electrode in the first direction, said longitudinal opening also having a width dimension larger than the distance D, said exhaust box disposed such that the longitudinal opening faces at least one of the first end and the second end of the film depositing electrode; and a second exhaust box, wherein said second exhaust box separately formed from the film depositing unit and disposed in the first direction and being longer than the electrode in the first direction, and said second exhaust box having a second longitudinal opening oriented in the first direction and also being longer than the electrode in the first direction, said second longitudinal opening having a width dimension larger than the distance D, and said second exhaust box being disposed such that the second longitudinal opening faces the other of the first end and the second end of the film depositing electrode, wherein the second longitudinal opening is oriented away from the surface of the drum, and wherein the electrode has a second segment adjacent to the second end, and said electrode is disposed so that the second segment is parallel to a second tangent line to the surface of the drum, and wherein the second exhaust box is disposed so that the width dimension of the second longitudinal opening extends in a direction that is oriented to be parallel to a line running from the center of the drum to the second end of the electrode.

13. The apparatus of claim 12, wherein the second longitudinal opening faces the gap between the drum and the electrode.

* * * * *